United States Patent
Wang et al.

(10) Patent No.: US 11,189,521 B2
(45) Date of Patent: Nov. 30, 2021

(54) METHODS OF MANUFACTURING REDISTRIBUTION CIRCUIT STRUCTURES USING PHASE SHIFT MASK

(71) Applicant: Taiwan Semiconductor Manufacturing Co., Ltd., Hsinchu (TW)

(72) Inventors: Chun-Chieh Wang, Yunlin County (TW); Hung-Jui Kuo, Hsinchu (TW); Jaw-Jung Shin, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 131 days.

(21) Appl. No.: 16/590,375

(22) Filed: Oct. 2, 2019

(65) Prior Publication Data
US 2020/0135543 A1    Apr. 30, 2020

Related U.S. Application Data

(60) Provisional application No. 62/752,358, filed on Oct. 30, 2018.

(51) Int. Cl.
*H01L 21/768* (2006.01)
*H01L 21/48* (2006.01)

(52) U.S. Cl.
CPC .... *H01L 21/76802* (2013.01); *H01L 21/4853* (2013.01); *H01L 21/76841* (2013.01)

(58) Field of Classification Search
CPC ........... H01L 21/76802; H01L 21/4853; H01L 21/76841
See application file for complete search history.

(56) References Cited

U.S. PATENT DOCUMENTS

2017/0271203 A1* 9/2017 Liu .................. H01L 24/19
2017/0323853 A1* 11/2017 Hu ................... H01L 21/486

OTHER PUBLICATIONS

Garza, C. M. et al. in "Benchmark comparison of i-line, alternating phse-shift masks", Optical Engineering, vol. 32, No. 10, pp. 2328-2336 (1993) (Year: 1993).*

Nagler, S. H. et al. in "Submicron Optical Lithography: i-Line Lens and Photoresist Technology," Proceedings of SPIE 0470, Optical Microlithography III: Technology for the Next Decade, (Jun. 29, 1984). (Year: 1984).*

* cited by examiner

*Primary Examiner* — Michael Jung
(74) *Attorney, Agent, or Firm* — JCIPRNET

(57) ABSTRACT

Methods of manufacturing redistribution circuit structures are disclosed and one of the methods includes the following steps. A seed layer is formed over a die and an encapsulant encapsulating the die. A photoresist material is formed over the seed layer. The photoresist material is exposed through a phase shift mask to an I-line wavelength within an I-line stepper using a numerical aperture equal to or less than 0.18. The photoresist material is developed to form a photoresist layer including photoresist patterns and openings therebetween. A conductive material is formed in the openings. The photoresist patterns are removed to form conductive patterns. By using the conductive patterns as a mask, the seed layer is partially removed, to form seed layer patterns under the conductive patterns, wherein redistribution conductive patterns include the seed layer patterns and the conductive patterns respectively.

20 Claims, 19 Drawing Sheets

METHODS OF MANUFACTURING REDISTRIBUTION CIRCUIT STRUCTURES USING PHASE SHIFT MASK

CROSS-REFERENCE TO RELATED APPLICATION

This application claims the priority benefit of U.S. provisional application Ser. No. 62/752,358, filed on Oct. 30, 2018. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. The integrated fan-out packages typically include a redistribution circuit structure laying over the molded integrated circuit devices such that the integrated circuit devices may be accessed. In order to meet the requirements for smaller sizes and higher packing densities, the manufacturing method for the redistribution circuit structure has become an important issue in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
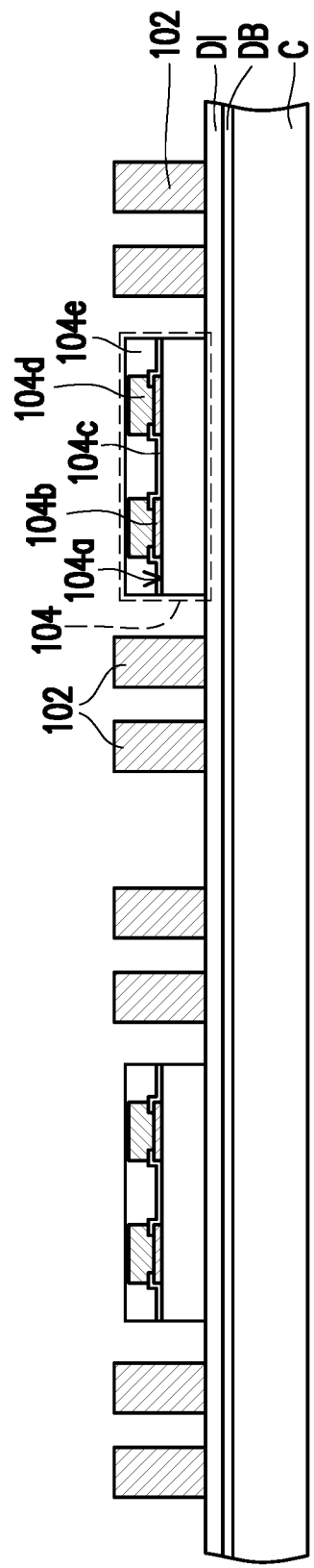
FIGS. 1A-1H are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIGS. 1A-1H are schematic cross-sectional views illustrating a manufacturing process of a package in accordance with some embodiments of the disclosure. Referring to FIG. 1A, a carrier C is provided. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. On the other hand, in some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of conductive posts 102 and a plurality of dies 104 are provided over the dielectric layer DI. The dies 104 are mounted onto the dielectric layer DI having the conductive posts 102 formed thereon. In some embodiments, a die attach film (DAF) (not illustrated) is located between the dies 104 and the dielectric layer DI for adhering the dies 104 onto the dielectric layer DI. The dies 104 are arranged in an array and are surrounded by the conductive posts 102. The dies 104 are, for example, semiconductor dies. Each of the dies 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c. The conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the protection layer 104e may be a polybenzoxazole (PBO) layer, a polyimide (PI) layer or other suitable polymers. In some alternative embodiments, the protection layer 104e may be made of inorganic materials. As illustrated in FIG. 1A, the top surfaces of the dies 104 are lower than the top surfaces of the conductive posts 102. However, the disclosure is not limited thereto. In some alternative embodiments, the top surfaces of the dies 104 may be substantially coplanar with or higher than the top surfaces of the conductive posts 102.

Figure 1B:
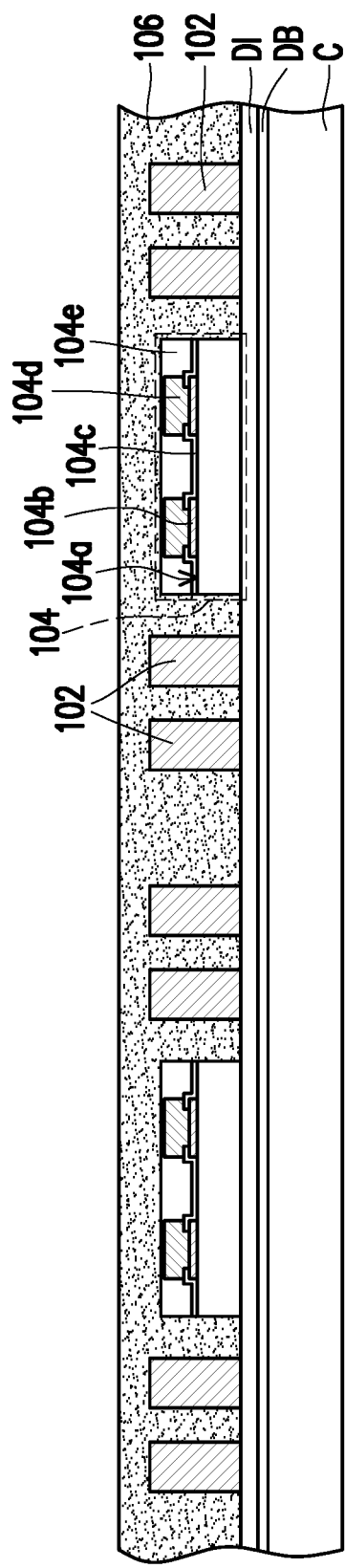

Referring to FIG. 1B, an insulating material 106 is formed on the dielectric layer DI to encapsulate the conductive posts 102 and the dies 104. In some embodiments, the insulating material 106 is a molding compound formed by a molding process. The conductive posts 102 and the protection layer 104e of the dies 104 are encapsulated by the insulating material 106. In other words, the conductive posts 102 and the protection layer 104e of the dies 104 are not revealed and are well protected by the insulating material 106. In some embodiments, the insulating material 106 may include epoxy or other suitable materials.

Figure 1C:
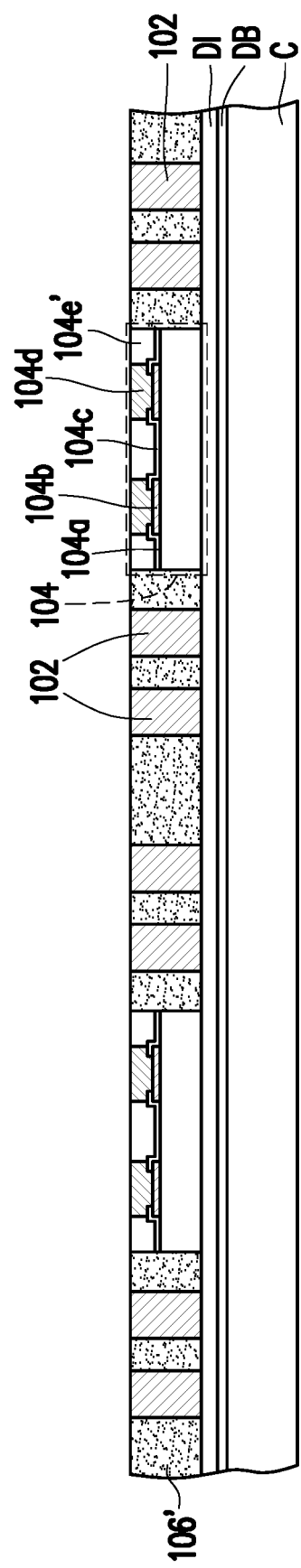

Referring to FIG. 1C, the insulating material 106 and the protection layer 104e of the die 104 are grinded until the top surfaces of the conductive pillars 104d are exposed. After the insulating material 106 is grinded, an encapsulant 106' is formed over the dielectric layer DI. During the aforementioned grinding process, portions of the protection layer 104e are also grinded to form a protection layer 104e'. In some embodiments, during the aforementioned grinding process of the insulating material 106 and the protection layer 104e, portions of the conductive pillars 104d and portions of the conductive posts 102 are grinded until the top surfaces of the conductive pillars 104d and the top surfaces of the conductive posts 102 are exposed. In other words, the encapsulant 106' exposes at least part of the dies 104 and at least part of the conductive posts 102. In some embodiments, the encapsulant 106' may be formed by a mechanical grinding, a chemical mechanical polishing (CMP), or another suitable mechanism.

The encapsulant 106' encapsulates the sidewalls of the die 104, and the encapsulant 106' is penetrated by the conductive posts 102. In other words, the die 104 and the conductive posts 102 are embedded in the encapsulant 106'. It should be noted that although the die 104 and the conductive posts 102 are embedded in the encapsulant 106', the encapsulant 106' exposes top surfaces of the dies 104 and the conductive posts 102. In other words, the top surfaces of the conductive posts 102, the top surface of the protection layer 104e', and the top surfaces of the conductive pillar 104d are substantially coplanar with the top surface of the encapsulant 106'.

In some embodiments, after forming the encapsulant 106' to encapsulate the dies 104, global warpage of the whole package may occur, for example, due to the CTE and stiffness differences between the dies 104 and the encapsulant 106'. The global warpage may cause a height variation (difference) across a top surface of the whole package which may range from 10 to 20 μm. In some embodiments, local warpage of individual die 104 may occur and cause a height variation (difference) across a top surface of individual die 104. However, in some embodiments, after the aforementioned grinding process, a height variation due to the local warpage may range from 3 to 5 μm which may be negligible.

Figure 1D:
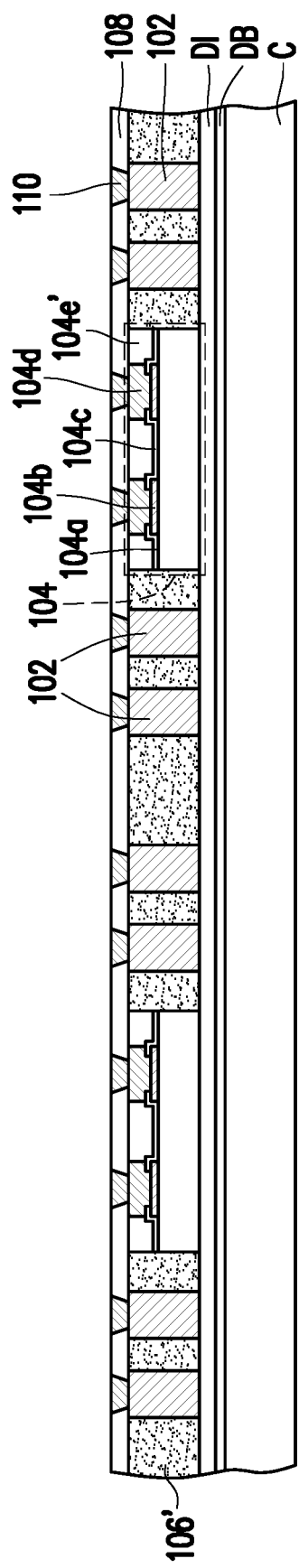

Referring to FIG. 1D, after the encapsulant 106' and the protection layer 104e' are formed, a dielectric layer 108 is formed over the top surfaces of the conductive posts 102, the top surface of the encapsulant 106', the top surfaces of the conductive pillars 104d, and the top surface of the protection layer 104e'. In some embodiments, the dielectric layer 108 is, for example, polymer such as polyimide, benzocyclobutene (BCB), polybenzoxazole (PBO), or the like. In some alternative embodiments, the dielectric layer 108 may include non-organic dielectric materials such as silicon oxide, silicon nitride, silicon carbide, silicon oxynitride, or the like. Then, a plurality of vias 110 are formed in the dielectric layer 108, where each of the vias 110 is electrically connected to either one of the conductive pillars 104d of the die 104 or one of the conductive posts 102. In some embodiments, a plurality of openings (not shown) are formed in the dielectric layer 108, and then the vias 110 are formed in the openings respectively. In some embodiments, the top surfaces of the conductive pillars 104d and the top surfaces of the conductive posts 102 are in contact with the vias 110. In some embodiments, the vias 110 are copper vias or other suitable metal vias, for example. In some embodiments, the via 110 may include a seed layer and a conductive layer thereon, for example.

Figure 1E:
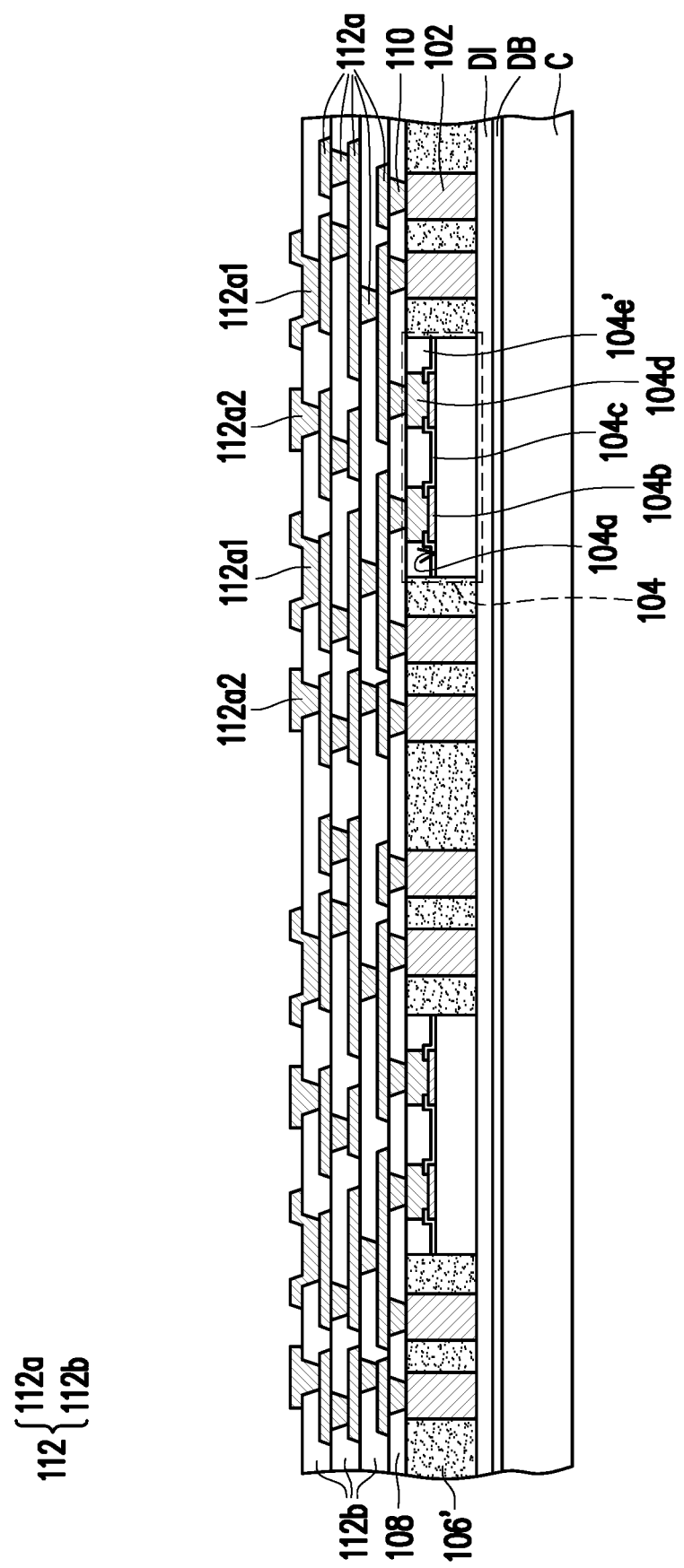

Referring to FIG. 1E, a redistribution circuit structure 112 electrically connected to the vias 110 is formed on the top surface of the dielectric layer 108. As shown in FIG. 1E, the redistribution circuit structure 112 includes a plurality of redistribution conductive patterns 112a and a plurality of inter-dielectric layers 112b which are stacked alternately. In some embodiments, the redistribution conductive patterns 112a are electrically connected to the vias 110 embedded in the dielectric layer 108, where the top surfaces of the vias 110 are in contact with the bottommost redistribution conductive patterns 112a of the redistribution circuit structure 112. Furthermore, the topmost redistribution conductive patterns 112a include a plurality of pads. In some embodiments, the aforementioned pads include a plurality of under-ball metallurgy (UBM) patterns 112a1 for ball mount and/or at least one connection pads 112a2 for mounting of passive components. The number of the under-ball metallurgy patterns 112a1 and the connection pad 112a2 is not limited in this disclosure.

The formation of the redistribution circuit structure 112 will be described in detail below. FIGS. 2A-2F are cross-sectional views illustrating a manufacturing process of the redistribution circuit structure 112 depicted in FIG. 1E, in accordance with some embodiments of the disclosure. It should be noted that the illustrations depicted in FIGS. 2A-2F merely serve as examples for demonstration. As such, scales, dimensions, and shapes illustrated in FIGS. 2A-2F may not completely reflect the redistribution circuit structure 112 illustrated in FIG. 1D. However, same elements are denoted by the same reference numeral to establish a correlation between FIGS. 2A-2F and FIG. 1E.

Currently, in order to cover high topography and high warpage characteristics of the package such as an integrated fan-out (INFO) package or INFO ultra-high density (UHD) package, I-line with low NA of 0.18 or less is applied to get a wider DOF. However, low NA causes low image contrast, and the pitch resolution (also referred to as "minimal pitch") is accordingly limited, that is, the pitch is larger than 2 μm. In other words, by using I-line and low NA, it is difficult to obtain a conductive line with a critical dimension in a sub-micron scale such as 1 μm or less. In detail, "pitch" is a sum of a line width and a space width, and a "minimal pitch (also referred to as pitch resolution)" is a pitch which can be resolved by a projection optical exposure apparatus with a pre-determined wavelength λ and numerical aperture NA. It is known that the pitch resolution is determined by Rayleigh formula: $R=k_1(\lambda/NA)$, where R is the resolution of a pattern, NA is the numerical aperture, λ is the wavelength of an exposure light, and $k_1$ is a constant. The DOF (depth of focus) is defined as DOF=$k_2$(λ/(NA)$^2$), where $k_2$ is a constant, NA is the numerical aperture, and λ is the wavelength of an exposure light. As mentioned before, high DOF is obtained by using I line and low NA, however, it adversely affects the pitch resolution. In some embodiments, in order to reduce the pitch without changing the exposure condition of I-line and low NA, a phase shift mask is adopted or the constant $k_1$ in Rayleigh formula is adjusted to improve pitch resolution. In other words, image contrast and optical resolution are increased while wide DOF is kept. Thus, the critical dimension of the pattern may be decreased to sub-micron scale under the exposure condition of I-line and low NA. In other words, the optical resolution is improved and exceeds current I-line exposure tool's capability.

Figure 2A:
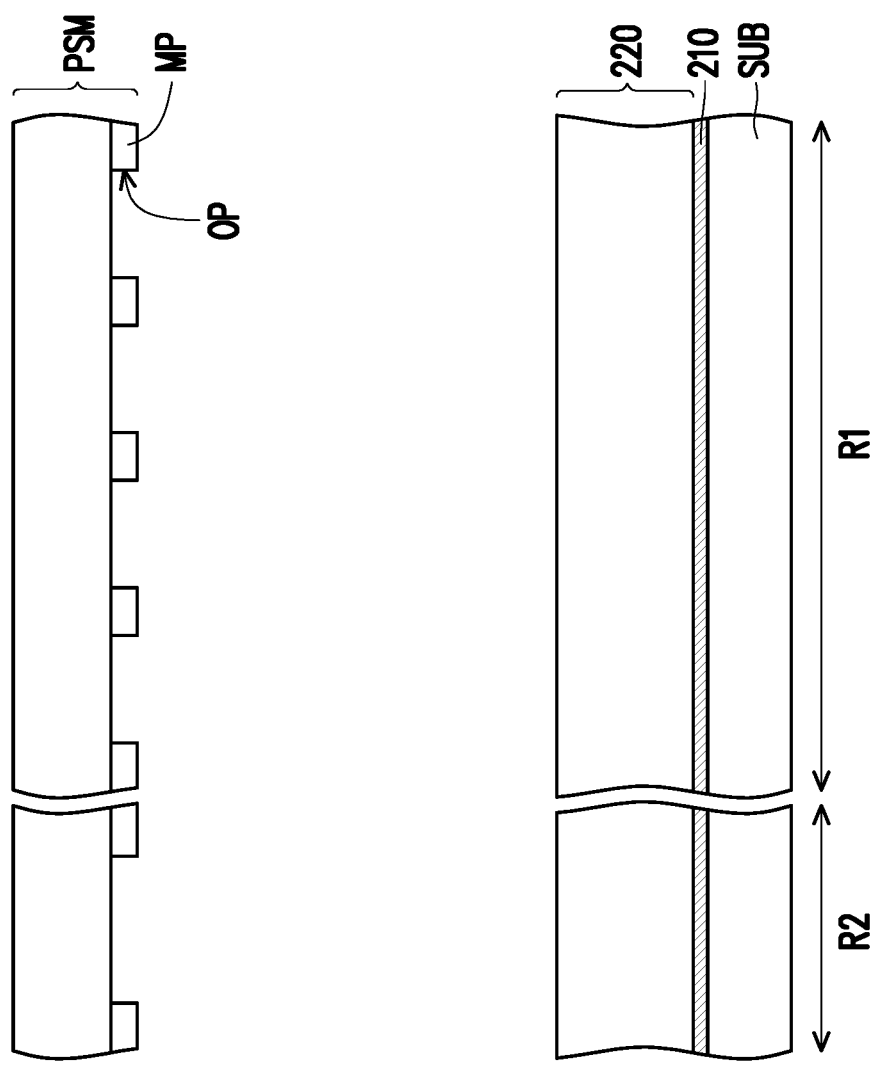
FIGS. 2A-2F are cross-sectional views illustrating a manufacturing process of a redistribution circuit structure, in accordance with some embodiments of the disclosure.

Referring to FIG. 2A, a substrate SUB is provided. The substrate SUB has a first region R1 and a second region R2. In some embodiments, the substrate SUB may include the carrier C, the de-bonding layer DB, the dielectric layer DI, the conductive posts 102, the dies 104, the encapsulant 106', the dielectric layer 108, and the vias 110 as shown in FIG. 1D. However, the disclosure is not limited thereto. Subsequently, a seed layer 210 is formed over the substrate SUB. In some embodiments, the seed layer 210 is formed over the top surfaces of the vias 110 and the dielectric layer 108. In some embodiments, the seed layer 210 is in contact with the top surfaces of the vias 110 and the dielectric layer 108. In some embodiments, a material of the seed layer 210 may include, for example, copper, copper alloys, or other suitable choice of materials. In some embodiments, the seed layer 210 is formed by a sputtering method, a deposition method such as physical vapor deposition or other applicable methods. In some embodiments, the seed layer 210 may have a thickness of approximately 0.01 μm to approximately 1 μm, for example.

In some embodiments, a photoresist material 220 may be formed over the seed layer 210, and a phase shift mask PSM is disposed corresponding to and over the photoresist material 220. In some embodiments, the photoresist material 220 is a positive photoresist. In alternative embodiments, the photoresist material 220 may be a negative photoresist, for example. In some embodiments, an I-line stepper (not shown, also referred as an I-line scanner) is provided. The I-line stepper is a lithography optic system of I-line type, that uses ultraviolet light (UV) with an exposure wavelength of 365 nm. The optical lithography system may include a light source, a light, a condense lens, a photomask, a mask stage, a projection lens, and a package stage, for example. However, other configurations and inclusion or omission of the system may be possible. The light source includes a radiation source providing the light having a single wavelength of 365 nm. For example, a mercury lamp may be utilized, which is operable to provide I-line (for example, 365 nm) wavelength. In some embodiments, the package of FIG. 2A is disposed on the package stage. In some embodiments, the photomask is a phase shift mask PSM, for example. The phase shift mask PSM may be an alternating aperture phase shift mask (alt-PSM), attenuating PSM (att-PSM) or other suitable phase shift mask, for example. In some embodiments, the phase shift mask PSM includes a plurality of patterns MP and a plurality of openings OP between the patterns MP. The patterns MP may be designed to form the redistribution conductive patterns 112a such as vias, conductive lines or other possible conductive patterns. In some embodiments, the phase shift mask PSM includes a plurality of patterns (not shown) designed to form the redistribution conductive patterns 112a such as vias, conductive lines or other possible conductive patterns.

Figure 2B:
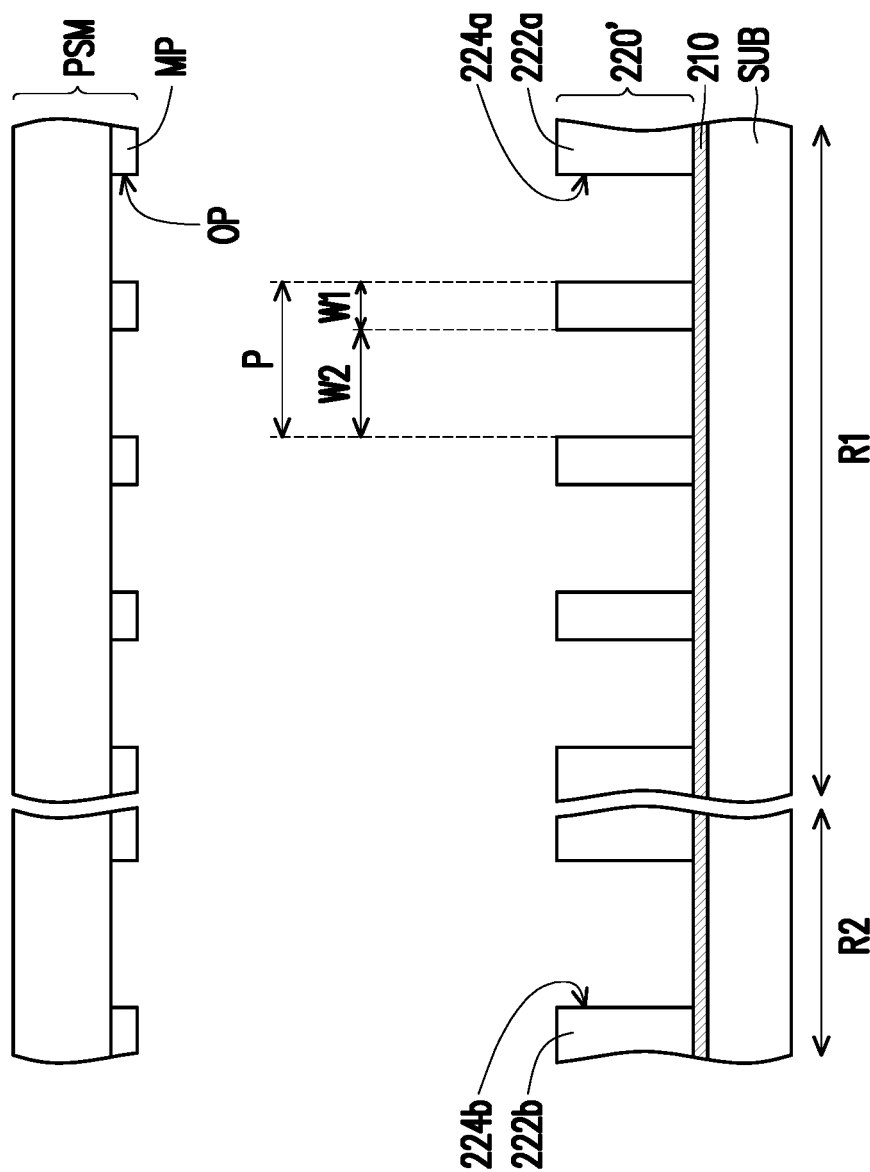

Referring to FIG. 2B, an exposure step is performed, that is, the photoresist material 220 is exposed through the phase shift mask PSM to the I-line wavelength within the I-line stepper using an exposure condition. Then, the photoresist material 220 is developed to form a photoresist layer 220', so as to transfer the patterns MP of the phase shift mask PSM onto the photoresist layer 220'. In some embodiments, the photoresist layer 220' includes a plurality of photoresist patterns 222a, 222b and a plurality of openings 224a, 224b between the photoresist patterns 222a, 222b. In some embodiments, the exposure condition is that in the Rayleigh's formula, λ is the wavelength of I-line (for example, 365 nm), NA is equal to or less than 0.18, and the constant $k_1$ is a positive constant equal to or less than 0.49. In some embodiments, by using the exposure condition, a pitch P of the photoresist layer 220' corresponding to the region R1 may be equal to or less than 2 μm. The pitch P (also referred to as a minimal pitch) is a sum of a width W1 of the photoresist pattern 222a (i.e., a line width) and a width W2 of the opening 224a (i.e., a space width). In some embodiments, when the constant $k_1$ is a positive constant equal to or less than 0.39, the pitch P is 1.6 μm, for example. In some embodiments, the width of the photoresist pattern 222a may be 0.5 μm, and the width of the opening 224a may be 1.1 μm, for example. In some alternative embodiments, the pitch may be equal to or less than 1.4 μm. For example, when the constant $k_1$ is a positive constant equal to or less than 0.35, the pitch may be 1.4 μm. In some embodiments, according to the requirements, a pitch of the photoresist layer 220' corresponding to other regions (such as the region R2 in which the photoresist pattern 222b is disposed) may be larger than 2 μm. In some embodiments, the openings 224a, 224b are disposed corresponding to the vias 110, and may be disposed directly over the vias 110, for example.

Figure 2C:
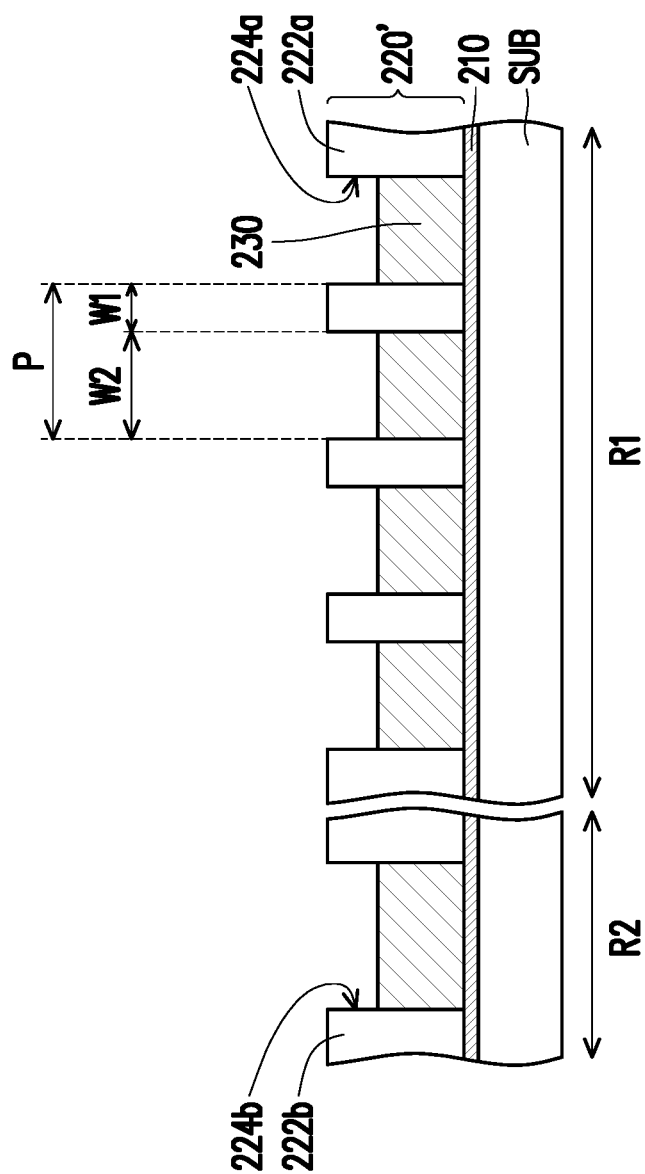

Referring to FIG. 2C, a conductive material 230 is partially filled into the openings 224a, 224b of the photoresist layer 220'. In some embodiments, the top surface of the conductive material 230 is lower than the top surface of the photoresist layer 220', for example. However, in some alternative embodiments, the top surface of the conductive material 230 may be substantially coplanar with the top surface of the photoresist layer 220'. In some embodiments, the conductive material 230 may be formed by a plating process. The plating process is, for example, electro-plating, electroless-plating, immersion plating, or the like. The conductive material 230 is, for example, copper, copper alloys, or the like. In some embodiments, the seed layer 210 and the conductive material 230 include the same material. For example, the seed layer 210 and the conductive material 230 are made of the same material.

Figure 2D:
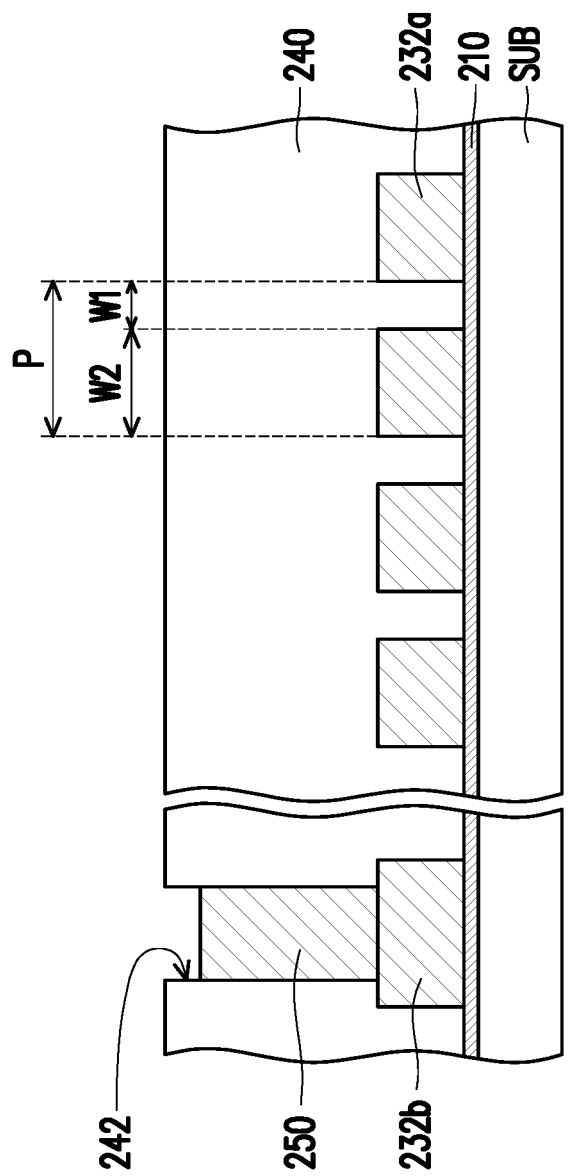

Referring to FIG. 2D, the photoresist layer 220' is subsequently removed to render a plurality of conductive patterns 232a, 232b, and portions of the seed layer 210 are exposed. Since the conductive patterns 232a, 232b are originated from the openings 224a, 224b, the conductive patterns 232a, 232b also inherent the same configuration. That is, a pitch P (also referred to as a minimal pitch) is a sum of a line width W2 of the conductive pattern 232a and a space width W1 between the conductive patterns 232a. The pitch P may be equal to or less than 2 μm. In some embodiments, the photoresist layer 220' is removed by a stripping process, for example. Portions of the seed layer 210 are covered by the conductive patterns 232a, 232b, and portions of the seed layer 210 between the conductive patterns 232a, 232b are exposed. In some embodiments, the conductive patterns 232a, 232b may be conductive lines, for example.

Figure 2E:
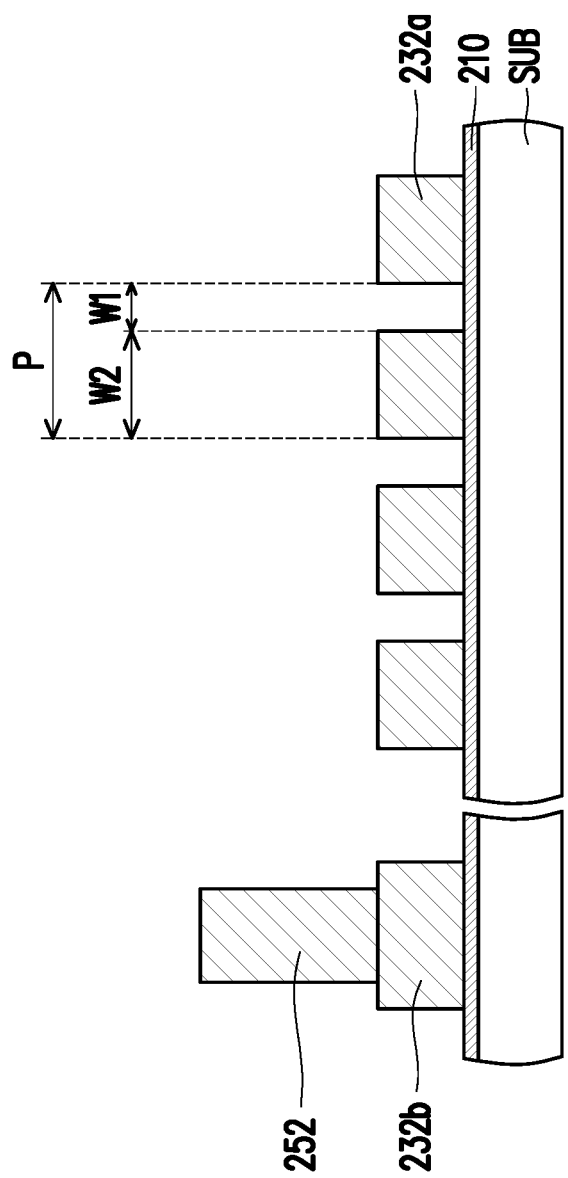

As shown in FIGS. 2D and 2E, in some embodiments, additional patterns may be formed above the conductive patterns 232a, 232b. For example, addition conductive pattern 252 may be formed in the second region R2. Referring to FIG. 2D, after that the formation of the conductive patterns 232a, 232b, a photoresist layer 240 is formed over the seed layer 210 and the conductive patterns 232a, 232b for additional patterning. In some embodiments, the photoresist layer 240 has an opening 242 to expose the conductive pattern 232b, for example. In some embodiments, a width of the opening 242 is smaller than a line width of the conductive pattern 232b, for example. Then, a conductive material 250 is partially filled into the opening 242 of the photoresist layer 240. In some embodiments, the top surface of the conductive material 250 is lower than the top surface of the photoresist layer 240, for example. In some embodiments, the conductive material 250 may be formed by a plating process. The plating process is, for example, electro-plating, electroless-plating, immersion plating, or the like. The conductive material 250 is, for example, copper, copper alloys, or the like.

Referring to FIG. 2E, then, the photoresist layer 240 is subsequently removed to render a conductive pattern 252 in the second region R2. In some embodiments, the conductive pattern 252 may be a via, for example. In some embodiments, the photoresist layer 240 is removed by a stripping process, for example. In some embodiments, a width of the conductive pattern 252 may be substantially the same as the width of the conductive pattern 232a, for example. In some alternative embodiments, the formation of the conductive pattern 252 may be omitted.

Figure 2F:
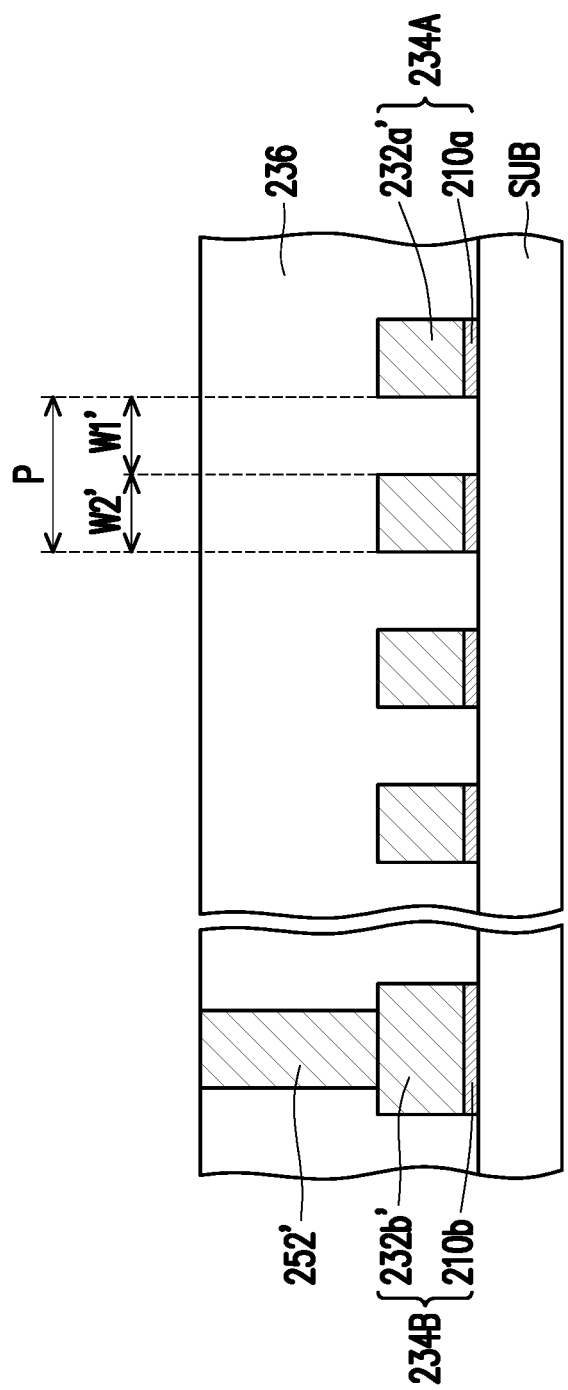

Referring to FIG. 2F, after that, by using the conductive patterns 232a, 232b as a mask layer, the seed layer 210 is partially removed, so as to form a plurality of seed layer patterns 210a, 210b under the conductive patterns 232a, 232b respectively. In detail, portions of the seed layer 210 exposed by the conductive patterns 232a, 232b are selectively removed through a wet etch or a dry etch, for example. It should be noted that, inevitably, materials of the conductive patterns 232a, 232b, 252 may be partially removed during the etching process of the seed layer 210. Specifically, the widths and/or heights of the conductive patterns 232a, 232b, 252 may be reduced, resulting in a plurality of remaining the conductive patterns 232a', 232b', 252'. In some embodiments, the remaining conductive pattern 232a' has a post-etching line width W2' smaller than the line width W2, the space width W1' between the conductive patterns 232a' is larger than the space width W1, and the pitch P is (W1'+W2') which is equal to (W1+W2). In other words, the pitch P remains substantially the same before and after the etching process of the seed layer 210 as illustrated FIGS. 2E-2F. In some embodiments, by controlling the line width and the space width of the photoresist layer 220' corresponding to the region R1 and conditions of the etching process of the seed layer 210, the desired line width of the conductive pattern 232a' may be obtained. For example, the line width W2' and the space width W1' may be respectively equal to a half of the pitch P. In an embodiment where the pitch P is 1.6 μm, the line width W2' and the space width W1' may be respectively 0.8 μm. In other words, the critical dimension is in sub-micron scale.

As illustrated in FIG. 2F, the sidewalls of the conductive patterns 232a', 232b' are substantially flush with the sidewalls of the seed layer patterns 210a. Through the foregoing etch process, the sidewalls of the conductive patterns 232a', 232b' are substantially aligned with sidewalls of the seed layer patterns 210a. The conductive pattern 232a', 232b' and the seed layer pattern 210a therebeneath constitute a conductive structure 234A, 234B which may serve as a conductive line or a via. The conductive pattern 252' may serve as a via. In some embodiments, a dielectric layer 236 may be formed to cover the conductive structure 234A, 234B and the conductive pattern 252' and may serve as one of the inter-dielectric layers 112b, for example. In some embodiments, the critical dimension of the conductive structure 234A may be decreased to sub-micron scale by adjusting the constant $k_1$ through the phase shift mask PSM or adjusting the constant $k_1$ through other means.

In some embodiments, the redistribution circuit structure 112 is a multi-layered structure (for example, the redistribution circuit structure 112 illustrated in FIG. 1E). Under this condition, the steps illustrated in FIGS. 2A-2F may be repeated several times to render the redistribution circuit structure 112. In some embodiments, the redistribution circuit structure 112 include at least one redistribution pattern 112a having the conductive structure 234A, and other redistribution pattern 112a may have any one of the conductive structures 234A, 234B and the conductive pattern 252' or other suitable structure.

It should be noted that the steps illustrated in FIGS. 2A-2F are not limited to fabricating the redistribution circuit structure 112 depicted in FIG. 1E. The foregoing step may be utilized in redistribution circuit structures located at other positions in a package. In some embodiments, the lower redistribution conductive patterns 112a close to the dies 104 may have a width smaller than a width of the upper redistribution conductive patterns 112a close to conductive terminals 114 (shown in FIG. 1F) since the dimension of the conductive pillars 104d is much smaller than the dimension of the conductive terminals 114. Therefore, in some embodiments, the aforementioned lithography may be applied to form the lower redistribution conductive patterns 112a. In some embodiments, the redistribution conductive patterns 112a having the conductive structure 234A may be contact with the vias 110, for example. In some alternative embodiments, the via 110 may be formed by applying the aforementioned lithography, for example.

Referring back to FIG. 1F, after the redistribution circuit structure 112 is formed, a plurality of conductive terminals 114 are placed on the under-ball metallurgy patterns 112a1, and a plurality of passive components 116 are mounted on the connection pads 112a2. In some embodiments, the conductive terminals 114 may be placed on the under-ball metallurgy patterns 112a1 through a ball placement process or other suitable processes and the passive components 116 may be mounted on the connection pads 112a2 through a soldering process, a reflowing process, or other suitable processes.

Figure 1F:
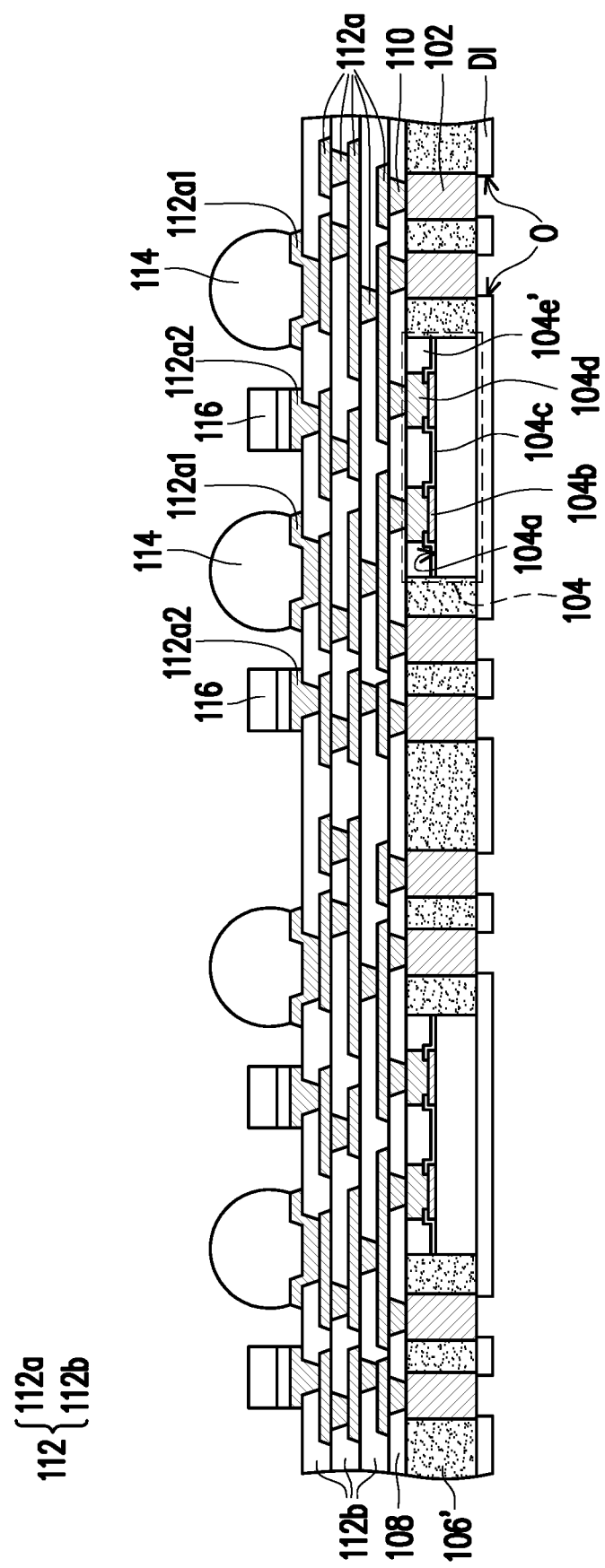
Figure 1G:
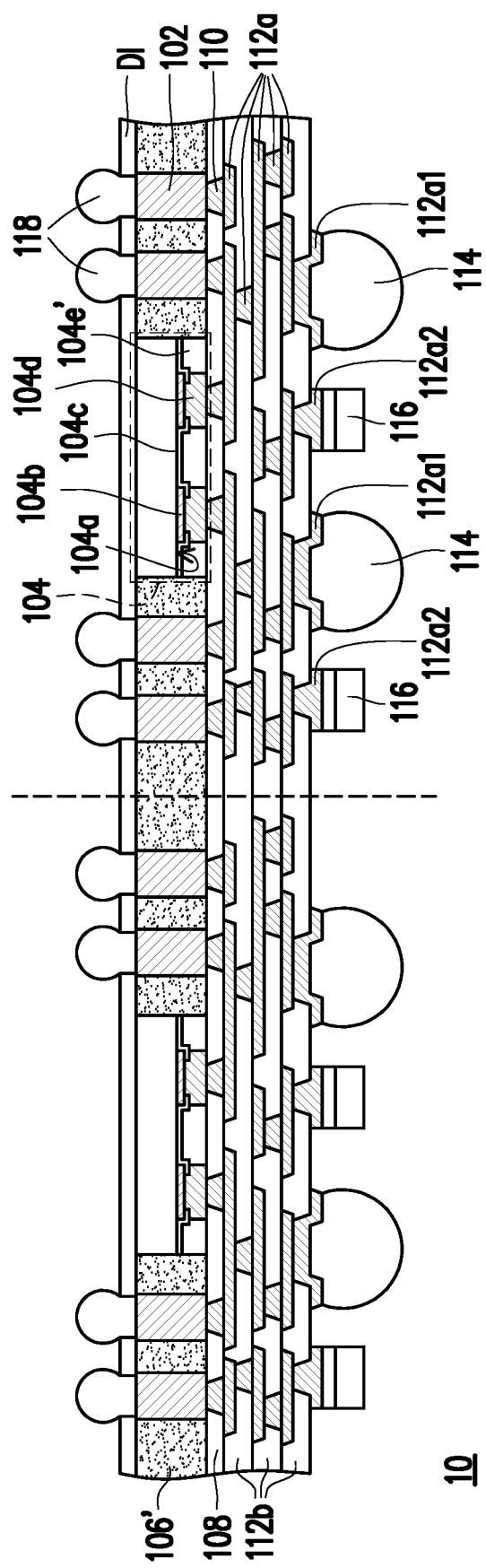

Referring to FIG. 1G, after the conductive terminals 114 and the passive components 116 are mounted on the redistribution circuit structure 112, the dielectric layer DI formed on the bottom surface of the encapsulant 106' is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser such that the dielectric layer DI adhered on the bottom surface of the encapsulant 106' is peeled from the carrier C. As illustrated in FIG. 1F, the dielectric layer DI is then patterned such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

Figure 1H:
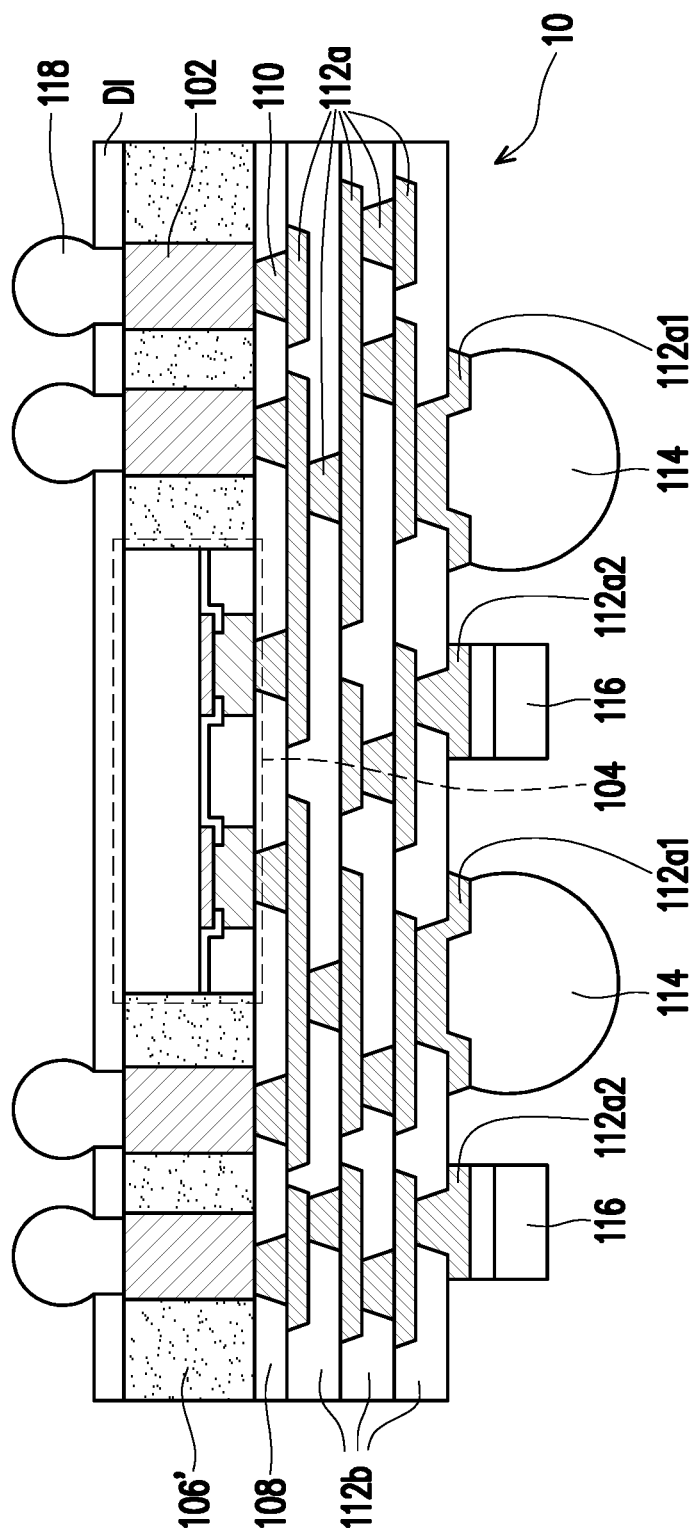

Referring to FIG. 1H, after the contact openings O are formed in the dielectric layer DI, a plurality of conductive terminals 118 are placed in the contact openings O, and the conductive terminals 118 are electrically connected to the conductive posts 102. Herein, formation of an integrated fan-out (INFO) package array is substantially completed. As illustrated in FIG. 1H, after the conductive terminals 114 and the conductive terminals 118 are formed, the INFO package array is diced to form a plurality of INFO packages 10 having dual-side terminal design. In some embodiment, the dicing process or singulation process typically involves dicing with a rotating blade or a laser beam. In other words, the dicing or singulation process is, for example, a laser cutting process, a mechanical cutting process, or other suitable processes. In some alternative embodiments, the INFO package 10 may be stack with other electronic devices such as another INFO package, a memory device, a ball grid array (BGA), or a wafer. For example, another package such an IC package may be stacked over and electrically connected to the INFO package 10 through the conductive terminals 118 such that the package-on-package (POP) structure is fabricated.

FIGS. 3A-3F are cross-sectional views illustrating a manufacturing process of the redistribution circuit structure 112 depicted in FIG. 1E in accordance with some embodiments of the disclosure. It should be noted that the illustrations depicted in FIGS. 3A-3F merely serve as examples for demonstration. As such, scales, dimensions, and shapes illustrated in FIGS. 3A-3F may not completely reflect the redistribution circuit structure illustrated in FIG. 1E. However, same elements are denoted by the same reference numeral to establish a correlation between FIGS. 3A-3F and FIG. 1E.

Figure 3A:
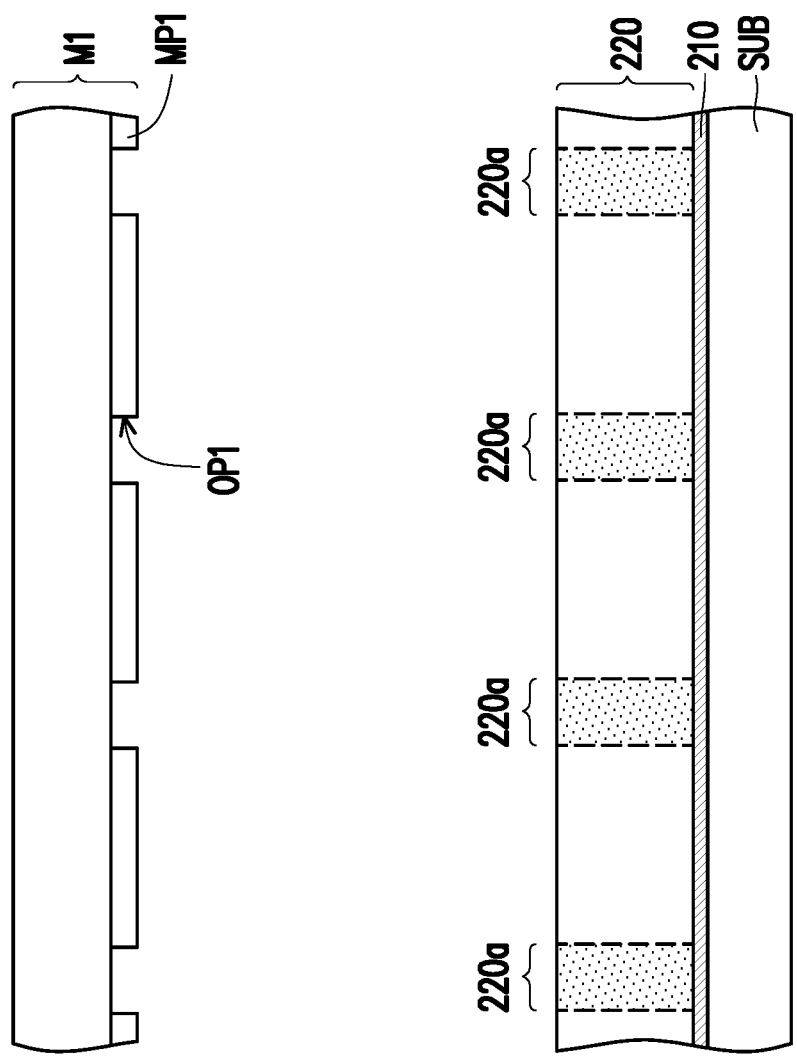
FIGS. 3A-3F are cross-sectional views illustrating a manufacturing process of a redistribution circuit structure, in accordance with some embodiments of the disclosure.

Referring to FIG. 3A, a substrate SUB is provided, and a seed layer 210 is formed over the substrate SUB. Then, a photoresist material 220 may be formed over the seed layer 210. The structure and the material of the substrate SUB, the seed layer 210 and the are photoresist material 220 are similar to those depicted in FIGS. 2A and 2B, and thus the details are omitted herein.

In some embodiments, in order to form a pitch in a sub-micron scale, a double exposure method is adopted. The double exposure method consists of two sequentially separated exposures on the same photoresist layer using two different photomasks. The double exposure can define minimally sized features with twofold enlarged line-to-space twice, and thus enhance the lithographic resolution.

After that, a first mask M1 is disposed over the photoresist material 220. Then, a first exposure step is performed, that is, the photoresist material 220 in first regions 220a is exposed through the first mask M1 to an I-line wavelength within an I-line stepper. In some embodiments, NA is equal to or less than 0.18. In some embodiments, the first mask M1 has a plurality of patterns MP1 and a plurality of openings OP1 between the patterns MP1, and the openings OP1 are disposed corresponding to the first regions 220a. In some embodiments, a ratio of a width of the pattern MP1 to a width of the opening OP1 is substantially 3:1, for example.

Figure 3B:
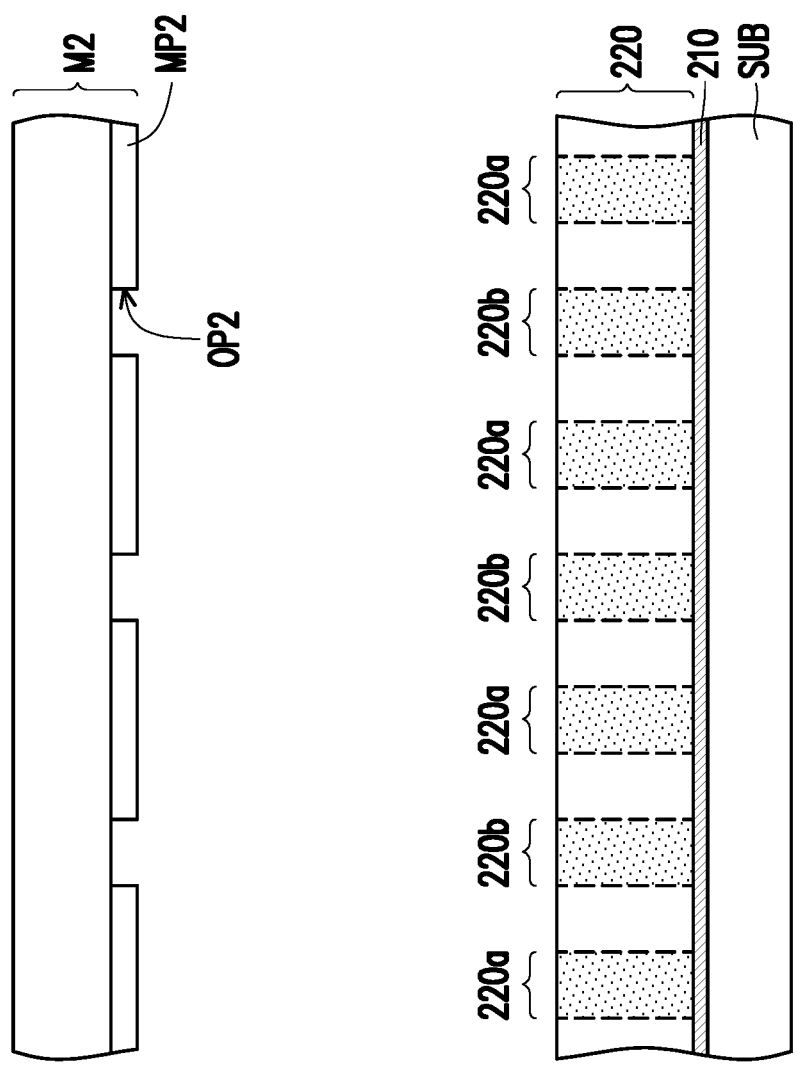

Referring to FIG. 3B, a second mask M2 is disposed over the photoresist material 220. Then, a second exposure step is performed, that is, the photoresist material 220 in second regions 220b is exposed through the second mask M2 to an I-line wavelength within an I-line stepper. In some embodiments, NA is equal to or less than 0.18. In some embodiments, the second mask M2 has a plurality of patterns MP2 and a plurality of openings OP2 between the patterns MP2, and the openings OP2 are disposed corresponding to the second regions 220b. In some embodiments, a ratio of a width of the pattern MP2 to a width of the opening OP2 is substantially 3:1, for example. In some embodiments, a pitch of the second mask M2 is equal to a pitch of the first mask M1. In some embodiments, the first regions 220a and the second regions 220b are alternately disposed.

Figure 3C:
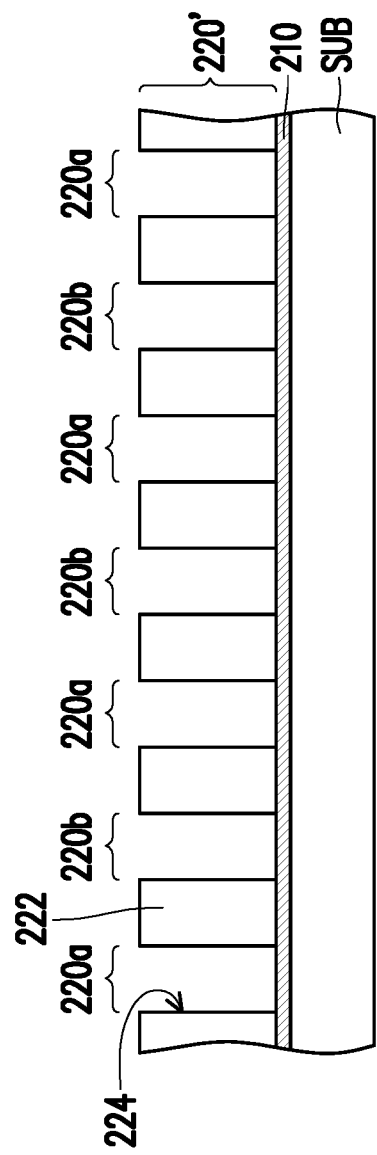

Referring to FIG. 3C, the photoresist material 220 is developed to form a photoresist layer 220', so as to transfer the patterns MP1 of the first mask M1 and the patterns MP2 of the second mask M2 onto the photoresist layer 220'. In some embodiments, the photoresist layer 220' includes a plurality of photoresist patterns 222 and a plurality of openings 224 between the photoresist patterns 222 in the portions 220a, 220b. The openings 224 are corresponding to the openings OP1, OP2, for example. In some embodiments, by using the double exposure, a pitch P of the photoresist layer 220' may be equal to or less than 2 µm. The pitch P is a sum of a width W1 of the photoresist pattern 222 (i.e., a line width) and a width W2 of the opening 224 (i.e., a space width). In some embodiments, the width W1 of the photoresist pattern 222 may be substantially equal to the width W2 of the opening 224, for example.

Figure 3D:
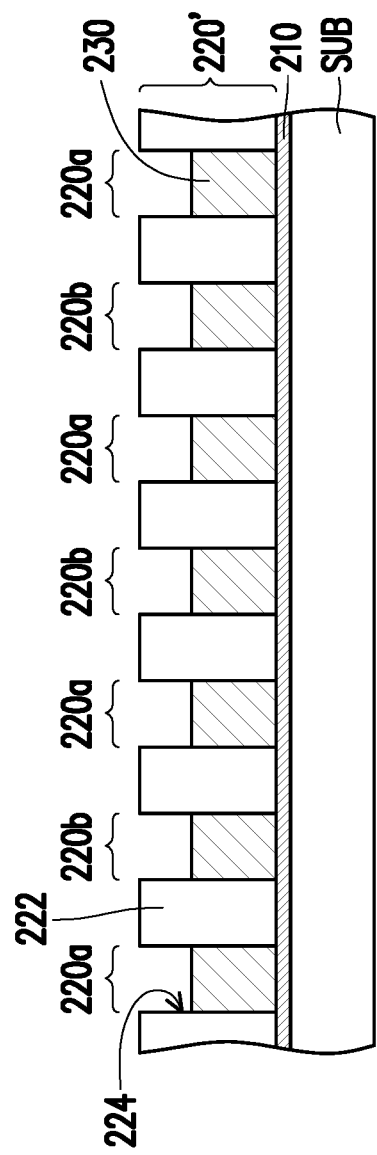

Referring to FIG. 3D, a conductive material 230 is partially filled into the openings 224 of the photoresist layer 220'. In some embodiments, the top surface of the conductive material 230 is lower than the top surface of the photoresist layer 220', for example. However, in some alternative embodiments, the top surface of the conductive material 230 may be substantially coplanar with the top surface of the photoresist layer 220'. In some embodiments, the conductive material 230 may be formed by a plating process. The plating process is, for example, electro-plating, electroless-plating, immersion plating, or the like. The conductive material 230 is, for example, copper, copper alloys, or the like. In some embodiments, the seed layer 210 and the conductive material 230 include the same material. For example, the seed layer 210 and the conductive material 230 are made of the same material.

Figure 3E:
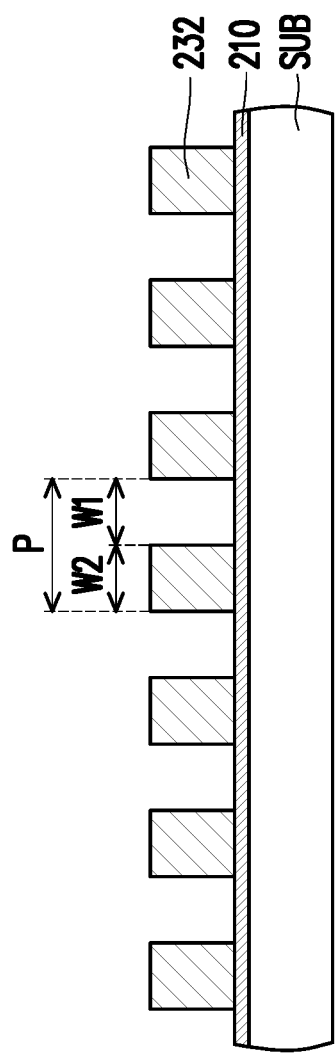

Referring to FIG. 3E, the photoresist layer 220' is subsequently removed to render a plurality of conductive patterns 232, and portions of the seed layer 210 are exposed. Since the conductive patterns 232 are originated from the openings 224, the conductive patterns 232 also inherent the same configuration. In some embodiments, the photoresist layer 220' is removed by a stripping process, for example. In some embodiments, the pitch P is a sum of a line width W2 of the conductive pattern 232 and a space width W1 between the conductive patterns 232.

Figure 3F:
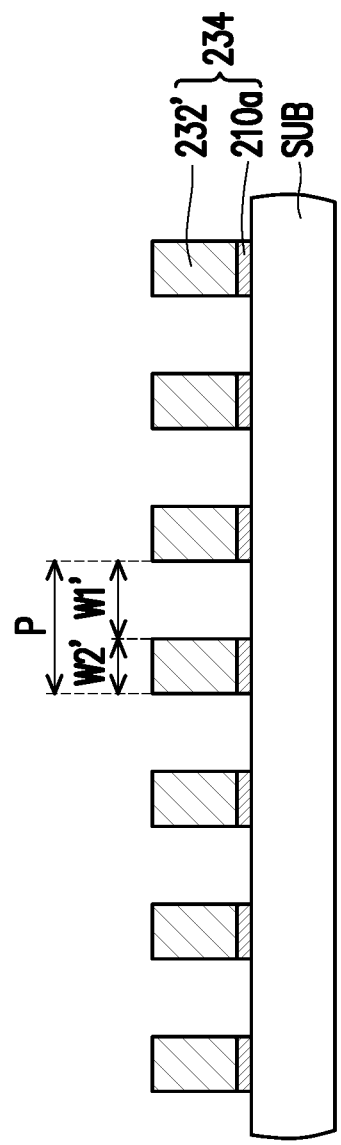

Referring to FIG. 3F, after that, by using the conductive patterns 232 as a mask, the seed layer 210 is partially removed, so as to form a plurality of seed layer patterns 210a under the conductive patterns 232 respectively. In detail, portions of the seed layer 210 exposed by the conductive patterns 232 are selectively removed through a wet etch or a dry etch, for example. It should be noted that, inevitably, materials of the conductive patterns 232 may be partially removed during the etching process of the seed layer 210. Specifically, the width W2 and/or height of the conductive pattern 232 may be reduced, resulting in a plurality of conductive patterns 232'. The conductive pattern 232' and the seed layer pattern 210a therebeneath constitute a conductive structure 234 which may serve as a conductive line or a via. In some embodiments, the conductive pattern 232' has a post-etching line width W2' smaller than the line width W2, the space width W1' between the conductive patterns 232' is larger than the space width W1, and the pitch P is (W1'+W2') which is equal to (W1+W2). In other words, the pitch P is constant before and after the etching process of the seed layer 210. In some embodiments, the pitch P is equal to or less than 2 µm, for example. In some embodiments, the pitch P is equal to or less than 1.4 µm, for example. In some embodiments, the line width and the space width may be equal to half of the pitch P, and may be 0.7 µm, for example. In some embodiments, by double exposure and pitch splitting, the critical dimension of the redistribution conductive patterns may be extended into sub-micron scale, which exceeds current I-line exposure tool's capability. Accordingly, fine pitch is achieved.

In some embodiments, the redistribution circuit structure 112 is a multi-layered structure (for example, the redistribution circuit structure 112 illustrated in FIG. 1E). Under this condition, the steps illustrated in FIGS. 3A-3F may be repeated several times to render the redistribution circuit structure 112. In some embodiments, the redistribution circuit structure 112 include at least one redistribution pattern 112a having the conductive structure 234, and other redistribution pattern 112a may have other suitable structure.

Conventionally, since the package such as INFO package or INFO UHD package has high topography and high warpage characteristics, the exposure tool with I-line and low NA of 0.18 or less is required to get a wider DOF, which causes low image contrast and limits pitch resolution. In some embodiments, by using the phase shift mask, adjusting the constant $k_1$ in the Rayleigh formula or using double exposure, image contrast and optical resolution are improved while wide DOF is kept with I-line and low NA. Thus, lithography performance and process window are significantly improved, and the large DOF and high resolution are both obtained. In other words, the optical resolution is improved and exceeds current I-line exposure tool's capability. Accordingly, the critical dimension of the redistribution conductive patterns may be extended into sub-micron scale. In addition, the aforementioned lithography may be applied to other elements which are required to form with I-line and low NA by I-line exposure tool.

In accordance with some embodiments of the present disclosure, a method of manufacturing a redistribution circuit structure includes the following steps. A seed layer is formed over a die and an encapsulant encapsulating the die. A first photoresist material is formed over the seed layer. The first photoresist material is exposed through a phase shift mask to an I-line wavelength within an I-line stepper using a numerical aperture equal to or less than 0.18. The first photoresist material is developed to form a first photoresist layer, wherein the first photoresist layer comprises a plurality of first photoresist patterns and a plurality of first openings between the plurality of first photoresist patterns. A first conductive material is formed in the plurality of first openings. The first photoresist layer is removed to form a plurality of first conductive patterns. By using the plurality of first conductive patterns as a mask, the seed layer is partially removed, to form a plurality of seed layer patterns under the plurality of first conductive patterns, wherein a plurality of redistribution conductive patterns include the plurality of seed layer patterns and the plurality of first conductive patterns respectively.

In accordance with alternative embodiments of the present disclosure, a method of manufacturing a redistribution circuit structure includes the following steps. A seed layer is formed over a die and an encapsulant encapsulating the die. A first photoresist material is formed over the seed layer. The first photoresist material is exposed through a mask to an I-line wavelength within an I-line stepper, using the condition that in the Rayleigh formula as $R=k_1(\lambda/NA)$, wherein R is the resolution of a pattern, NA is the numerical aperture, $\lambda$ is the wavelength of an exposure light, and $k_1$ is a positive constant equal to or less than 0.49. The first photoresist material is developed to form a first photoresist layer, wherein the first photoresist layer comprises a plurality of first photoresist patterns and a plurality of first openings between the plurality of first photoresist patterns. A first conductive material is formed in the plurality of first opening. The first photoresist layer is removed, to form a plurality of first conductive patterns. By using the plurality of first conductive patterns as a mask layer, the seed layer is partially removed to form a plurality of seed layer patterns under the plurality of first conductive patterns, wherein a plurality of redistribution conductive patterns include the plurality of seed layer patterns and the plurality of first conductive patterns respectively.

In accordance with yet alternative embodiments of the present disclosure, a method of manufacturing a redistribution circuit structure includes the following steps. A seed layer is formed over a die and an encapsulant encapsulating the die. A photoresist material is formed over the seed layer. First portions of the photoresist material are exposed through a first mask to an I-line wavelength within an I-line stepper by a first exposure using a numerical aperture equal to or less than 0.18. Second portions of the photoresist material through a second mask to the I-line wavelength within the I-line stepper by a second exposure using a numerical aperture equal to or less than 0.18, wherein the first portions and the second portions are alternately disposed. The photoresist material is developed to form a photoresist layer, wherein the photoresist layer comprises a plurality of photoresist patterns and a plurality of openings between the plurality of photoresist patterns. A conductive material is formed in the plurality of openings. The photoresist layer is removed, to form a plurality of conductive patterns. By using the plurality of conductive patterns as a mask, the seed layer is partially removed to form a plurality of seed layer patterns under the plurality of conductive patterns, wherein a plurality of redistribution conductive patterns include the plurality of seed layer patterns and the plurality of conductive patterns respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a redistribution circuit structure, the method comprising:
   forming a seed layer over a die;
   forming a first photoresist material over the seed layer;

exposing the first photoresist material through a phase shift mask to an I-line wavelength within an I-line stepper using a numerical aperture equal to or less than 0.18;
developing the first photoresist material to form a first photoresist layer, wherein the first photoresist layer comprises a plurality of first photoresist patterns and a plurality of first openings between the plurality of first photoresist patterns;
forming a first conductive material in the plurality of first openings;
forming a second photoresist layer over the first conductive material, wherein the second photoresist layer comprises at least one second opening;
forming a second conductive material in the at least one second opening;
removing the first photoresist layer and the second photoresist layer, to form a plurality of first conductive patterns and at least one second conductive pattern;
using the plurality of first conductive patterns as a mask, partially removing the seed layer, to form a plurality of seed layer patterns under the plurality of first conductive patterns; and
forming a dielectric layer, wherein the at least one second conductive pattern is disposed in the dielectric layer.

2. The method of claim 1, wherein a line width of the plurality of first conductive patterns is equal to or less than 1 μm.

3. The method of claim 1, wherein a line width of the plurality of first conductive patterns is equal to or less than 0.7 μm.

4. The method of claim 1, wherein the seed layer is partially removed by an etching process, and the plurality of first conductive patterns are partially removed by the etching process.

5. The method of claim 1, wherein the seed layer is partially removed by an etching process, and the plurality of first conductive patterns and the at least one second conductive pattern are partially removed by the etching process.

6. The method of claim 1, wherein the first photoresist layer and the second photoresist layer are removed simultaneously.

7. The method of claim 1, wherein the die comprises a conductive pillar thereon, and one of the plurality of seed layer patterns is in contact with the conductive pillar.

8. The method of claim 1 further comprising forming an encapsulant to encapsulate the die.

9. The method of claim 1, wherein the plurality of first conductive patterns are disposed in the dielectric layer.

10. A method of manufacturing a redistribution circuit structure, the method comprising:
forming a seed layer over a die;
forming a first photoresist material over the seed layer;
exposing the first photoresist material through a mask to an I-line wavelength within an I-line stepper, using the condition that in the Rayleigh formula as $R=k_1(\lambda/NA)$, wherein R is the resolution of a pattern, NA is the numerical aperture, $\lambda$ is the wavelength of an exposure light, and $k_1$ is a positive constant equal to or less than 0.49;
developing the first photoresist material to form a first photoresist layer, wherein the first photoresist layer comprises a plurality of first photoresist patterns and a plurality of first openings between the plurality of first photoresist patterns;
forming a first conductive material in the plurality of first opening;
removing the first photoresist layer, to form a plurality of first conductive patterns; and
using the plurality of first conductive patterns as a mask layer, partially removing the seed layer, to form a plurality of seed layer patterns under the plurality of first conductive patterns, wherein a plurality of redistribution conductive patterns include the plurality of seed layer patterns and the plurality of first conductive patterns respectively, and the seed layer is partially removed by an etching process, and the plurality of first conductive patterns are partially removed by the etching process.

11. The method of claim 10, wherein $k_1$ is a positive constant equal to or less than 0.35.

12. The method of claim 10, wherein a line width of the plurality of first conductive patterns is equal to or less than 1 μm.

13. The method of claim 10, wherein a line width of the plurality of first conductive patterns is equal to or less than 0.7 μm.

14. The method of claim 10, wherein after performing the etching process, a width of the plurality of first conductive patterns is reduced, and a space between the plurality of first conductive patterns is increased.

15. The method of claim 10, wherein the die comprises a conductive pillar thereon, and one of the plurality of seed layer patterns is in contact with the conductive pillar.

16. The method of claim 10, wherein the mask is a phase shift mask.

17. A method of manufacturing a redistribution circuit structure, the method comprising:
forming a seed layer over a die;
forming a photoresist material over the seed layer;
exposing first portions of the photoresist material through a first mask to an I-line wavelength within an I-line stepper by a first exposure;
exposing second portions of the photoresist material through a second mask to the I-line wavelength within the I-line stepper by a second exposure, wherein the first portions and the second portions are alternately disposed;
developing the photoresist material to form a photoresist layer, wherein the photoresist layer comprises a plurality of photoresist patterns and a plurality of openings between the plurality of photoresist patterns;
forming a conductive material in the plurality of openings;
removing the photoresist layer, to form a plurality of conductive patterns; and
using the plurality of conductive patterns as a mask, partially removing the seed layer, to form a plurality of seed layer patterns under the plurality of conductive patterns, wherein a plurality of redistribution conductive patterns include the plurality of seed layer patterns and the plurality of conductive patterns respectively, wherein the seed layer is partially removed by an etching process, and the plurality of conductive patterns are partially removed by the etching process.

18. The method of claim 17, wherein a line width of the plurality of conductive patterns is equal to or less than 1 μm.

19. The method of claim 17, wherein a line width of the plurality of conductive patterns is equal to or less than 0.7 μm.

20. The method of claim 17, wherein exposing second portions of the photoresist material through the second mask to the I-line wavelength is performed with a numerical aperture equal to or less than 0.18.

\* \* \* \* \*